United States Patent [19]
Hiroki et al.

[11] Patent Number: 5,512,771
[45] Date of Patent: Apr. 30, 1996

[54] MOS TYPE SEMICONDUCTOR DEVICE HAVING A LOW CONCENTRATION IMPURITY DIFFUSION REGION

[75] Inventors: Akira Hiroki, Osaka; Kazumi Kurimoto, Kobe; Shinji Odanaka, Hirakata, all of Japan

[73] Assignee: Matsushita Electric Industrial Co., Ltd., Osaka, Japan

[21] Appl. No.: 147,866

[22] Filed: Nov. 4, 1993

[30] Foreign Application Priority Data

Nov. 4, 1992 [JP] Japan ................................. 4-294819
Nov. 4, 1992 [JP] Japan ................................. 4-294820

[51] Int. Cl.$^6$ ................. H01L 29/76; H01L 29/94; H01L 31/062; H01L 31/113
[52] U.S. Cl. ................. 257/369; 257/336; 257/344; 257/408
[58] Field of Search ................. 257/408, 336, 257/344, 369

[56] References Cited

U.S. PATENT DOCUMENTS

| | | | |
|---|---|---|---|
| 4,951,100 | 8/1990 | Parrillo .................................. | 257/408 |
| 5,102,816 | 4/1992 | Manukonda et al. .................. | 437/44 |
| 5,132,757 | 7/1992 | Tignor et al. .......................... | 257/408 |
| 5,217,910 | 6/1993 | Shimizu et al. ........................ | 437/35 |
| 5,241,203 | 8/1993 | Hsu et al. ............................... | 257/344 |
| 5,258,319 | 11/1993 | Inuishi et al. .......................... | 257/344 |

FOREIGN PATENT DOCUMENTS

| | | | |
|---|---|---|---|
| 61-112379 | 5/1986 | Japan .................................... | 257/408 |
| 62-118578 | 5/1987 | Japan .................................... | 257/408 |
| 3-109773 | 5/1991 | Japan .................................... | 257/336 |
| 3-272145 | 12/1991 | Japan .................................... | 257/408 |
| 4-58562 | 2/1992 | Japan .................................... | 257/408 |
| 4-133333 | 5/1992 | Japan .................................... | 257/408 |
| WO91/15030 | 10/1991 | WIPO .................................... | 257/408 |

OTHER PUBLICATIONS

Huang, T. Y. et al., "A Novel Submicron LDD Transistor With Inverse-T Gate Structure", *IEEE IEDM, Technical Digest*, pp. 742–745 (1986).

Izawa, R. et al, "Impact of the Gate–Drain Overlapped Device" (Gold).

"For Deep Submicrometer VLSI", *IEEE Transactions on Electron Devices*, vol. 35, No. 12, pp. 2088–2093 (Dec. 1988).

S. Hsia et al., "Polysilicon Oxidation Self–Aligned MOS (POSA MOS)–A New Self–Aligned Double Source/Drain Ion Implantation Technique for VLSI" *IEEE Electron Device Letters*, vol. EDL–3, No. 2, pp. 40–42 (FEb. 1982).

EPO, Partial European Search Report for counterpart application EP93 11 7804, mailed Dec. 28, 1993.

*Primary Examiner*—Steven H. Loke
*Attorney, Agent, or Firm*—Ratner & Prestia

[57] ABSTRACT

An MOS type semiconductor device comprises a semiconductor substrate including a p-type region doped with p-type impurities and having a surface and an MOS transistor formed in the p-type region, the MOS transistor including: an n-type source region formed in the p-type region; an n-type drain region formed in the p-type region and separated from the n-type source region by a predetermined distance; a channel region formed in the p-type region and located between the n-type source and drain regions; a pair of n-type impurity diffusion regions formed on both sides of the channel region and having an impurity concentration lower than that of the n-type source region; a gate insulating film formed on the surface of the semiconductor substrate, the gate insulating film directly covering the channel region and the pair of n-type impurity diffusion regions; a gate electrode formed on the gate insulating film; and side walls formed on the sides of the gate electrode, wherein each of the side walls has a bottom portion extending along the surface of the semiconductor substrate from each side of the gate electrode, and each of the n-type source and drain regions has a first portion covered with the bottom portion of the side wall and a second portion not covered with the bottom portion, a thickness of the first portion being smaller than that of the second portion. A method for fabricating such an MOS type semiconductor device is also provided.

5 Claims, 9 Drawing Sheets

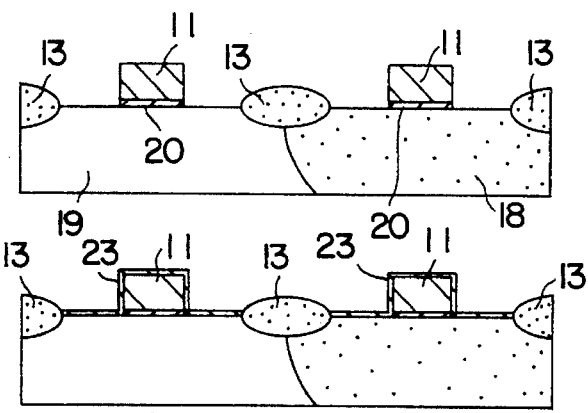
FIG. 13A
FIG. 13B
FIG. 13C
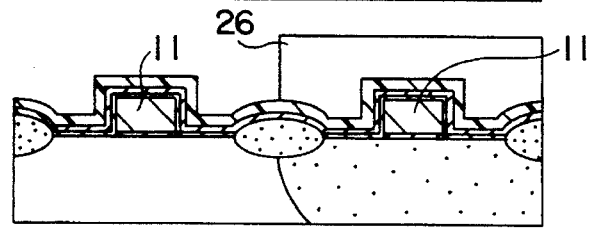
FIG. 13D
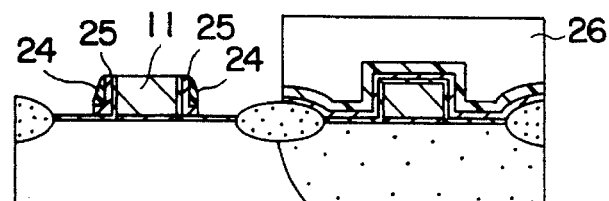
FIG. 13E
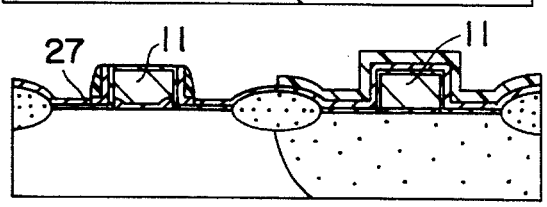
FIG. 13F
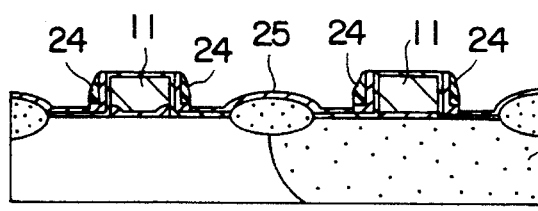
FIG. 14A
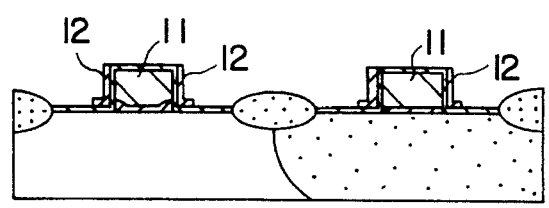
FIG. 14B

MOS TYPE SEMICONDUCTOR DEVICE HAVING A LOW CONCENTRATION IMPURITY DIFFUSION REGION

BACKGROUND OF THE INVENTION

1. Field of the Invention

The present invention relates to a semiconductor device and a method for fabricating the same. More specifically, the present invention relates to an MOS (metal oxide semiconductor) type semiconductor device and a complementary MOS (CMOS) type semiconductor device, and a method for fabricating the same.

2. Description of the Related Art

In recent years, in pursuit of a higher integration of a VLSI (very large scale integrated circuit), an MOS type semiconductor device used for such a VLSI has been increasingly miniaturized. At present, there is realized a device having a channel length as small as half a micron. As the device is miniaturized, however, the electric characteristics of the device may be degraded by hot carriers. This brings a serious problem with regard to the reliability of the device.

In order to minimize the degradation of the device caused by hot carriers and moreover to improve the device characteristics such as transconductance, a gate-drain overlap LDD (lightly doped drain) structure has been proposed. Examples of such a structure includes an ITLDD structure proposed in T. Y. Hung, "IEEE 1986 IEDM", Technical Digest, pp. 742–745 and a GOLD structure proposed in R. Izawa, "IEEE Transaction on Electron Devices", vol. 35, pp. 2088–2093, 1988.

Referring to FIG. 16, an MOS transistor having the gate-drain overlap LDD structure will be described.

The transistor includes n-type high-concentration source/drain diffusion regions 33 and n-type low-concentration diffusion regions 34 both of which are formed in a p-type semiconductor substrate 31, a gate oxide film 32 formed on a portion of the semiconductor substrate 31, a gate electrode 35 formed on the gate oxide film 32, and gate side walls 36 formed on both sides of the gate electrode 35. The high-concentration source/drain diffusion regions 33 extend to reach a portion beneath the ends of the gate electrode 35. The low-concentration diffusion regions 34 are entirely located beneath the gate electrode 35. With this structure, the electric field generated laterally in the low-concentration diffusion regions 34 is weakened by a potential applied to the gate electrode 35 enough to reduce the generation of hot carriers. Moreover, carriers in the low-concentration diffusion regions 34 can be completely controlled by the gate electrode 35, and the source resistance at the low-concentration diffusion regions 34 is reduced. As a result, the drivability of the device improves.

However, the gate-drain overlap LDD structure has problems when they are applied to an MOS transistor having a channel length of a half-micron or less as follows:

(1) Since the low-concentration diffusion regions 34 are entirely located beneath the gate electrode 35, the effective channel length $L_{eff}$ has a following relationship:

$$L_{eff} < L_g - 2 \times L_{ldd}$$

wherein $L_g$ is the gate length and $L_{ldd}$ is the width of the low-concentration diffusion regions 34 (measured in the channel direction).

The width $L_{ldd}$ of the low-concentration diffusion regions 34 requires at least 0.1 μm. Therefore, for an MOS transistor with the gate-drain overlap LDD structure, the effective channel length $L_{eff}$ is shorter than the gate length $L_g$ by at least 0.2 μm. When the channel length of the transistor is half a micron or less, the effective channel length $L_{eff}$ is as small as 0.3 μm or less. As a result, the infant degradation of the characteristics of the device generally caused when the channel thereof is shorter (short channel effects) becomes more eminent, compared with the case of an LDD structure.

(2) Since the low-concentration diffusion regions 34 are entirely located beneath the gate electrode 35, the drivability of the transistor improves. However, this results in the increase in the gate-to-drain capacitance. This significantly lowers the driving characteristics of a circuit including the MOS transistor.

(3) When the thickness of the gate oxide film 32 is 10 nm or less, a tunnel current is induced between the energy bands, which may become an additional cause of a leak current.

(4) At least two masking steps are required for forming the low-concentration diffusion regions 34 and the high-concentration source/drain diffusion regions 33. For a CMOS circuit, a total of four or more masking steps are required including similar masking steps for forming a p-channel MOS transistor.

For the above reasons, favorable transistor characteristics will not be obtained if the gate-drain overlap structure is applied to an MOS transistor having a channel length of half a micron or less. Moreover, when it is applied to a CMOS circuit, the entire fabricating process thereof will be further complicated.

Now, problems of an MOS type semiconductor device with the LDD structure will be described as follows by showing the fabricating process thereof with reference to FIGS. 17A to 17C:

As shown in FIG. 17A, impurities of a second conductivity type such as phosphorus (P) ions are implanted into a surface area of a semiconductor substrate 31 using a gate electrode 35 as a mask, thereby forming the low-concentration diffusion regions 34. Thereafter, as shown in FIG. 17B, an oxide film is first deposited on the semiconductor substrate 31 covering the gate electrode 35 to a thickness of approximately 200–250 nm. Then, the oxide film is removed by anisotropic dry etching except portions thereof deposited on the sides of the gate electrode 35. At this etching, since the width of the oxide film left unetched on the sides of the gate electrode 35, i.e., gate side walls 36 greatly depends on the conditions of the etching, it is difficult to form the gate side walls 36 with high accuracy. Therefore, when the width of the resultant gate side walls 36 formed on the sides of the gate electrode 35 is large as shown in FIG. 17C, the high-concentration source/drain diffusion regions 33 formed by the diffusion of implanted impurities of a second conductivity type such as As ions do not extend to reach a portion beneath the gate electrode 35.

As a result, following problems arise:

(1) Though the short channel effects become less significant, the generation of hot carriers increases, compared with the case of the gate-drain overlap LDD structure.

(2) Though the gate-to-drain capacitance decreases, the drivability of the device decreases.

(3) At least two masking steps are required for forming the low-concentration diffusion regions 34 and the high-concentration source/drain diffusion regions 33. For a CMOS circuit, a total of four or more masking steps are required including similar masking steps for forming a p-channel MOS transistor.

SUMMARY OF THE INVENTION

The MOS type semiconductor device of this invention comprises a semiconductor substrate including a first conductivity type region doped with first conductivity type impurities and having a surface and an MOS transistor formed in the first conductivity type region, the MOS transistor including: a second conductivity type source region formed in the first conductivity type region; a second conductivity type drain region formed in the first conductivity type region and separated from the second conductivity type source region by a predetermined distance; a channel region formed in the first conductivity type region and located between the second conductivity type source region and the second conductivity type drain region; a pair of second conductivity type impurity diffusion regions formed on both sides of the channel region and having an impurity concentration lower than that of the second conductivity type source region; a gate insulating film formed on the surface of the semiconductor substrate, the gate insulating film directly covering the channel region and the pair of second conductivity type impurity diffusion regions; a gate electrode formed on the gate insulating film; and side walls formed on the sides of the gate electrode, wherein each of the side walls has a bottom portion extending along the surface of the semiconductor substrate from each side of the gate electrode, and each of the second conductivity type source and drain regions has a first portion covered with the bottom portion of the side wall and a second portion not covered with the bottom portion, the first portion being thinner than the second portion.

Alternatively, the MOS type semiconductor device of the present invention comprises a semiconductor substrate including a first conductivity type region doped with first conductivity type impurities and having a surface and an MOS transistor formed in the first conductivity type region, the MOS transistor including: a second conductivity type source region formed in the first conductivity type region; a second conductivity type drain region formed in the first conductivity type region and separated from the second conductivity type source region by a predetermined distance; a pair of second conductivity type impurity diffusion regions formed so as to cover the PN-junction between the second conductivity type source region and the first conductivity type region and the PN-junction between the second conductivity type drain region and the first conductivity type region, and having an impurity concentration lower than that of the second conductivity type source region; a channel region formed in the first conductivity type region and located between the pair of the second conductivity type impurity diffusion regions; a gate insulating film formed on the surface of the semiconductor substrate and directly covering the channel region; a gate electrode formed on the gate insulating film; and side walls formed on the sides of the gate electrode, wherein each of the side walls has a bottom portion extending along the surface of the semiconductor substrate from each side of the gate electrode.

According to another aspect of the present invention, there is provided a method for fabricating an MOS type semiconductor device comprising a semiconductor substrate including a first conductivity type region doped with first conductivity type impurities and having a surface and an MOS transistor formed in the first conductivity type region, the method comprising steps of: depositing a first insulating film to be used as a gate insulating film of the transistor and a conductive material film to be used as a gate electrode of the transistor on the semiconductor substrate in this order so as to cover the first conductivity type region; patterning the conductive material film to form the gate electrode; depositing a second insulating film and a third insulating film which hardly transmits an oxidizing substance on the semiconductor substrate in this order so as to cover the gate electrode; etching the third insulating film and the second insulating film in this order by an anisotropic etching technique, leaving part of the third insulating film and the second insulating film unetched on the sides of the gate electrode; removing the third insulating film selectively by a selective etching technique, thereby forming L-shaped side walls made of the second insulating film; implanting second conductivity type impurity ions into the semiconductor substrate using the gate electrode as a mask, thereby forming second conductivity type impurity diffusion regions; and implanting second conductivity type impurity ions into the semiconductor substrate using the gate electrode as a mask, thereby forming second conductivity type source and drain regions with an impurity concentration higher than that of the second conductivity type impurity diffusion regions, each having a first portion covered with the side wall and a second portion not covered with the side wall, the first section being thinner than the second portion.

Alternatively, there is provided a method for fabricating an MOS type semiconductor device comprising a semiconductor substrate including a first conductivity type region doped with first conductivity type impurities and having a surface and an MOS transistor formed in the first conductivity type region, the method comprising steps of: depositing a first insulating film to be used as a gate insulating film and a conductive material film to be used as a gate electrode on the semiconductor substrate in this order so as to cover the first conductivity type region; patterning the conductive material film to form the gate electrode; depositing a second insulating film and a third insulating film which hardly transmits an oxidizing substance on the semiconductor substrate in this order so as to cover the gate electrode; etching the third insulating film and the second insulating film in this order by an anisotropic etching technique, leaving part of the third insulating film and the second insulating film unetched on the sides of the gate electrode; removing the third insulating film selectively by a selective etching technique, thereby forming L-shaped side walls made of the second insulating film; implanting second conductivity type impurity ions into the semiconductor substrate using the gate electrode and the side walls as a mask at an accelerating energy at which the impurity ions are not transmitted through the side walls, thereby forming second conductivity type source and drain regions in portions of the semiconductor substrate substantially not covered with the gate electrode and the side walls; and implanting second conductivity type impurity ions into the semiconductor substrate using the gate electrode as a mask at an accelerating energy at which the impurity ions are not transmitted through the side walls, thereby forming second conductivity type impurity diffusion regions with an impurity concentration lower than and a thickness greater than those of the second conductivity type source and drain regions.

According to yet another aspect of the present invention, the complementary MOS type semiconductor device comprises a semiconductor substrate including an n-type region doped with n-type impurities and a p-type region doped with p-type impurities and having a surface, an n-channel MOS transistor formed in the p-type region, and a p-channel MOS transistor formed in the n-type region, the n-channel MOS transistor including: an n-type source region formed in the p-type region; an n-type drain region formed in the p-type region and separated from the n-type source region by a predetermined distance; a channel region formed in the p-type region and located between the n-type source region and the n-type drain region; a pair of n-type impurity diffusion regions formed on both sides of the channel region and having an impurity concentration lower than that of the n-type source region; a gate insulating film formed on the surface of the semiconductor substrate, the gate insulating film directly covering the channel region and the pair of n-type impurity diffusion regions, portions of the gate insulating film above the pair of n-type impurity diffusion regions being thicker than a portion thereof above the channel region; and a gate electrode formed on the gate insulating film, the p-channel MOS transistor including: a p-type source region formed in the n-type region; a p-type drain region formed in the n-type region and separated from the p-type source region by a predetermined distance; a channel region formed in the n-type region and located between the p-type source region and the p-type drain region; a gate insulating film formed on the surface of the semiconductor substrate and having a uniform thickness; and a gate electrode formed on the gate insulating film.

According to yet another aspect of the present invention, there is provided a method for fabricating a complementary MOS type semiconductor device comprising a semiconductor substrate including an n-type region doped with n-type impurities and a p-type region doped with p-type impurities and having a surface, an n-channel MOS transistor formed in the p-type region, and a p-channel MOS transistor formed in the n-type region, the method comprising the steps of: depositing a first insulating film to be used as a gate insulating film and a conductive material film to be used as a gate electrode of the transistor on the semiconductor substrate in this order so as to cover the p-type region and the n-type region; patterning the conductive material film to form the gate electrode; depositing a second insulating film and a third insulating film which hardly transmits an oxidizing substance on the semiconductor substrate in this order so as to cover the gate electrode; forming a resist covering the gate electrode of the p-channel MOS transistor on the n-type region; etching portions of the third insulating film and the second insulating film not covered with the resist in this order by an anisotropic etching technique, leaving part of the third insulating film and the second insulating film unetched on the sides of the gate electrode of the n-channel MOS transistor and on the n-type region; removing the resist; oxidizing the bottom ends of the gate electrode, thereby thickening the end portions of the gate insulating film; etching portions of the third insulating film and the second insulating film in this order by an anisotropic etching technique, leaving part of the third insulating film and the second insulating film unetched on the sides of the gate electrode of the p-channel MOS transistor; removing the third insulating film selectively by a selective etching technique, thereby forming L-shaped side walls made of the second insulating film; forming a resist covering the p-channel MOS transistor on the n-type region; implanting n-type impurity ions into the p-type region using the resist as a mask, thereby forming n-type source and drain regions, each having a first portion covered with the side wall and a second portion not covered with the side wall, the first section being thinner than the second portion, and providing the n-type conductivity to the gate electrode of the n-channel MOS transistor; implanting n-type impurity ions into the p-type region using the resist as a mask, thereby forming n-type impurity diffusion regions with an impurity concentration lower than that of the n-type source and drain regions; forming a resist covering the n-channel MOS transistor on the p-type region; implanting p-type impurity ions into the n-type region using the resist as a mask, thereby forming p-type source and drain regions each having a first portion covered with the side wall and a second portion not covered with the side wall, the first section being thinner than the second portion, and providing the n-type conductivity to the gate electrode of the p-channel MOS transistor; and implanting p-type impurity ions into the n-type region using the resist as a mask, thereby forming p-type impurity diffusion regions with an impurity concentration lower than that of the p-type source and drain regions.

Thus, the invention described herein makes possible the advantages of (1) providing an MOS type semiconductor device and a complementary MOS type semiconductor device capable of operating at high speed, minimizing the short channel effects, and providing high reliability, and (2) providing a method for fabricating such an MOS type semiconductor device and a complementary device.

These and other advantages of the present invention will become apparent to those skilled in the art upon reading and understanding the following detailed description with reference to the accompanying figures.

BRIEF DESCRIPTION OF THE DRAWINGS

FIGS. 13A to 13F are sectional views showing the steps for fabricating the complementary MOS type semiconductor device shown in FIG. 12 of the present invention.

FIGS. 14A to 14E are sectional views showing the steps for fabricating the complementary MOS type semiconductor device shown in FIG. 12 of the present invention.

DESCRIPTION OF THE PREFERRED EMBODIMENTS

The MOS type semiconductor device and the method for fabricating the same according to the present invention will be described by way of example with reference to the attached drawings as follows:

EXAMPLE 1

Figure 1:
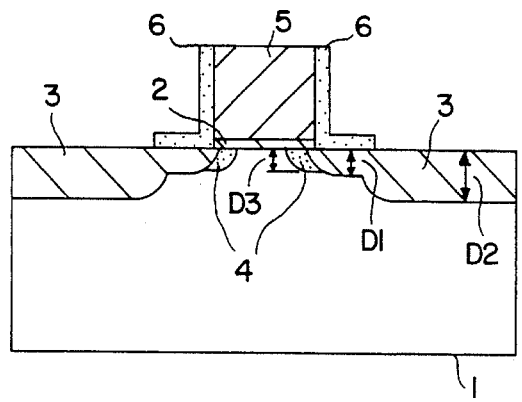
FIG. 1 is a sectional view of a first example of the MOS type semiconductor device of the present invention.

FIG. 1 is a sectional view of a first example of the present invention, which is an MOS type semiconductor device including an MOS transistor formed on a p-type semiconductor substrate 1 doped with p-type (a first conductivity type) impurities.

The MOS transistor includes n-type high-concentration source/drain diffusion regions 3 formed in the semiconductor (silicon) substrate 1 and a channel region formed between the high-concentration source/drain diffusion regions 3. N-type low-concentration diffusion regions 4 doped with n-type impurities at a concentration lower than that of the high-concentration source/drain diffusion regions 3 are formed on both sides of the channel region.

A gate insulating film 2 is formed on a portion of a surface of the semiconductor substrate 1 to directly cover the channel region and the low-concentration diffusion regions 4. A gate electrode 5 is formed on the gate insulating film 2. L-shaped side walls 6 are formed on both sides of the gate electrode 5 with bottom portions extending outwardly along the surface of the semiconductor substrate 1. Each of the high-concentration source/drain diffusion regions 3 has a first portion covered with the bottom portion of the L-shaped side wall 6 and a second portion uncovered therewith. The thickness of the first portion (a PN-junction depth D1) is smaller than that of the second portion (a PN-junction depth D2).

One of the features of this example is that the PN-junction depth D1 is smaller than the PN-junction depth D2 and that a PN-junction depth D3 of the low-concentration diffusion regions 4 is equal to or smaller than the PN-junction depth D1. This structure is more effective in minimizing potential expansion from the source/drain diffusion regions toward the channel region, compared with the conventional gate-drain overlap LDD structure. This results in effectively minimizing the decrease of the threshold voltage ($V_t$) which arises in a conventional MOSFET having a channel length of half a micron or less.

Further, the high-concentration source/drain diffusion regions 3 extend to reach a portion beneath the ends of the gate electrode 5, and the low-concentration diffusion regions 4 are entirely located beneath the gate electrode 5 through the gate insulating film 2. With this structure, as in the conventional gate-drain overlap structure described earlier, the electric field generated laterally in the low-concentration diffusion regions 4 can be sufficiently weakened by a potential applied to the gate electrode 5.

Moreover, the concentration of impurities implanted in the first portion of the high-concentration source/drain diffusion regions 3 by ion implantation through the L-shaped side walls 6 is as low as approximately $10^{19}$ cm$^{-3}$. This further weakens the lateral electric field and decreases the gate-to-drain capacitance.

Furthermore, since electrons trapped in the L-shaped side walls 6 which are oxide films formed on the gate electrode 5 and the surface state produced thereby are located above the high-concentration source/drain diffusion regions 3, they will not enhance the degradation of the device characteristics. Moreover, carriers in the low-concentration diffusion regions 4 can be completely controlled by the gate electrode 5, and the source resistance at the low-concentration diffusion regions 4 is reduced. As a result, the drivability of the device improves.

Figure 9:
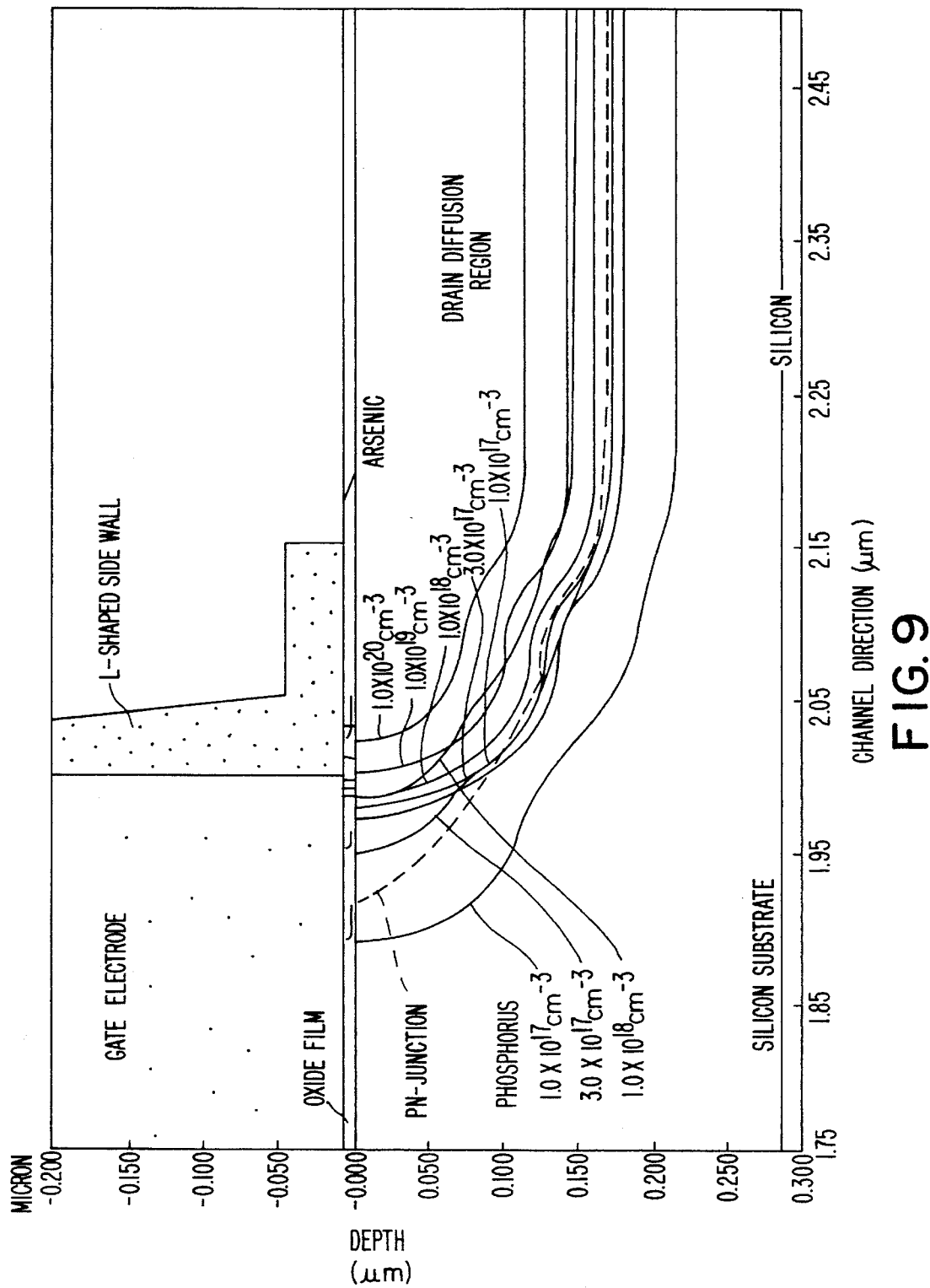
FIG. 9 is a contour diagram showing an example of the impurity concentration distribution in the first example of the present invention.

FIG. 9 is a contour diagram showing the impurity concentration distribution obtained from a simulation conducted under the conditions as follows: arsenic ions were implanted into a silicon substrate at an energy of 80 KeV and a dose of $6\times10^{15}$ cm$^{-2}$ through an L-shaped side wall having a width of 50 nm in the side portion and a length of 150 nm and a thickness of 40 nm in the bottom portion, so as to form a high-concentration source/drain diffusion region. Following the As implantation, phosphorous ions were implanted into the silicon substrate at an energy of 60 KeV and a dose of $4\times10^{13}$ cm$^{-2}$, so as to form a low-concentration diffusion region.

As is apparent from FIG. 9, the PN-junction depth of a portion of the high-concentration source/drain diffusion region located beneath the L-shaped side wall is smaller than that of the remaining portion thereof located outside the L-shaped side wall. The impurity concentration of the former portion is as low as approximately $10^{19}$ cm$^{-3}$. The low-concentration diffusion region located beneath the gate electrode was formed so that the PN-junction depth thereof was in the same level as that of the portion of the high-concentration source/drain diffusion region beneath the L-shaped side wall.

EXAMPLE 2

Figure 2:
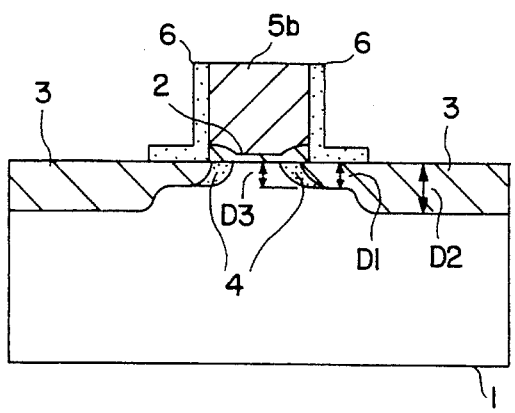
FIG. 2 is a sectional view of a second example of the MOS type semiconductor device of the present invention.

FIG. 2 is a sectional view of a second example of the MOS type semiconductor device according to the present invention.

The MOS type semiconductor device of this example is structurally different from that of Example 1 in the following point: A gate electrode 5b of the MOS type semiconductor device of this example has a downward convex-shaped bottom as shown in FIG. 2. More specifically, a gate insulating film 2 is thicker in both end portions than in the center portion thereof. As in Example 1, low-concentration diffusion regions 4 are located beneath the ends of the gate electrode 5b. Thus, since the thickness of the end portions of the gate insulating film 2 which are interposed between the low-concentration diffusion regions 4 and the gate electrode 5b is greater than that of the center portion thereof located above the channel region of the semiconductor substrate 1. As a result, the gate-to-drain capacitance is smaller than that generated by the conventional gate-drain overlap LLD structure. This improves the speed of the circuit operation, thus realizing a semiconductor IC capable of operating at high speed. Further, due to the thicker gate insulating film, the tunnel current between the bands induced by the potential application to the gate electrode can be reduced. Moreover, as in Example 1, according to the MOS type semiconductor device of this example, the short channel effects and the degradation caused by the generation of hot carriers can be minimized, and thus high reliability can be obtained.

EXAMPLE 3

Figure 3:
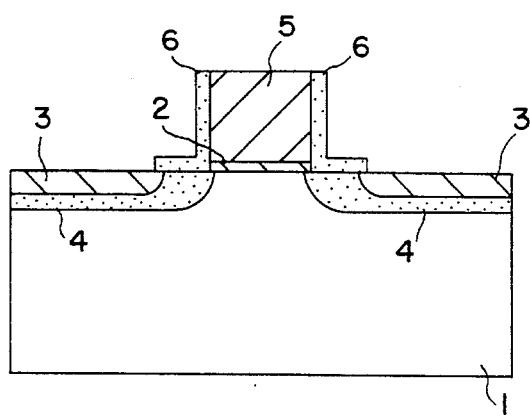
FIG. 3 is a sectional view of a third example of the MOS type semiconductor device of the present invention.

FIG. 3 is a sectional view of a third example of the MOS type semiconductor device according to the present invention.

A main feature of the MOS type semiconductor device of this example is that low-concentration diffusion regions 4 of the second conductivity type is formed so that the ends thereof are located beneath the ends of a gate electrode 5 through a gate insulating film 2. With this structure, the effective channel length of the MOS type semiconductor device of this example is substantially equal to the width of the gate electrode 5. Also, high-concentration source/drain diffusion regions 3 of the second conductivity type are shallower than the low-concentration diffusion regions 4, and formed so that the ends thereof reach the ends of bottom portions of L-shaped side walls 6. This structure effectively minimizes the potential expansion from the source/drain diffusion regions toward the channel region, thus minimizing the decrease of the threshold voltage ($V_t$) which arises in a conventional MOSFET having a channel length of half a micron or less.

EXAMPLE 4

Figure 4:
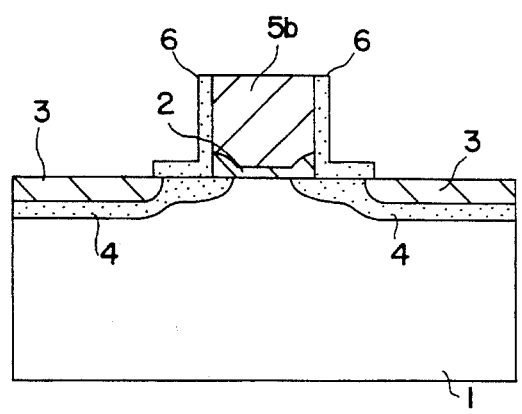
FIG. 4 is a sectional view of a fourth example of the MOS type semiconductor device of the present invention.

FIG. 4 is a sectional view of a fourth example of the MOS type semiconductor device according to the present invention.

The MOS type semiconductor device of this example is structurally different from that of Example 3 in the following point: A gate electrode 5b of the MOS type semiconductor device of this example has a downward convex-shaped bottom as shown in FIG. 4. More specifically, a gate insulating film 2 is thicker in both end portions than in the center portion. As in Example 3, low-concentration diffusion regions 4 of the second conductivity type are formed so that the ends thereof are located beneath the ends of the gate electrode 5b through the gate insulating film 2. Thus, the thickness of the end portions of the gate insulating film 2 which are interposed between the low-concentration diffusion regions 4 and the gate electrode 5b is greater than that of the center portion thereof located above the channel region of the semiconductor substrate 1. As a result, the gate-to-drain capacitance is smaller than that generated by the conventional gate-drain overlap LDD structure. This improves the speed of the circuit operation, thus realizing a semiconductor IC capable of operating at high speed. Further, due to the thicker gate insulating film, the tunnel current between the bands induced by the potential application to the gate electrode can be reduced. Moreover, as in Example 1, according to the MOS type semiconductor device of this example, the short channel effects and the degradation caused by the generation of hot carriers can be minimized, and thus high reliability can be obtained.

Characteristic evaluations were conducted for the MOS type semiconductor devices of Examples 1 to 4 and the above-described two conventional examples. The results are shown in Table 1 below. In Table 1, the mark ⊙ indicates "excellent", the mark O "good", the mark Δ "moderate", and the mark X "bad".

TABLE 1

| | Minimizing short channel effects | Circuit characteristics (overlap capacitance) | Drivability | Minimizing hot carriers | Minimizing tunnel leak between energy bands | Improving masking step |
|---|---|---|---|---|---|---|
| Ex.1 | ⊙ | O | ⊙ | ⊙ | X | ⊙ |
| Ex.2 | ⊙ | ⊙ | O | ⊙ | ⊙ | ⊙ |
| Ex.3 | O | O | X | Δ | O | ⊙ |
| Ex.4 | ⊙ | O | X | Δ | ⊙ | ⊙ |
| Conv. Ex.1 (Overlap LDD) | X | O | ⊙ | ⊙ | X | X |
| Conv. Ex.2 (LDD) | X | X | X | Δ | O | X |

EXAMPLE 5

Figure 5A:
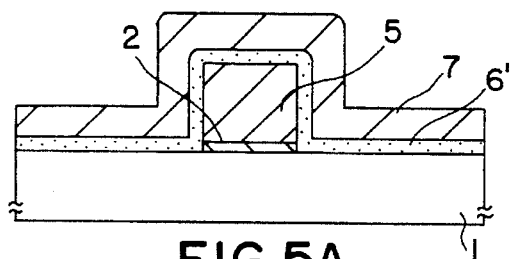
FIGS. 5A to 5C are sectional views showing the steps for lubricating the MOS type semiconductor device of the first example of the present invention.

Now, referring to FIGS. 5A to 5C, the method for fabricating the MOS type semiconductor device of Example 1 shown in FIG. 1 will be described as follows:

As shown in FIG. 5A, the gate insulating film 2 is formed on a portion of a surface of the p-type semiconductor substrate 1. Then, the gate electrode 5 is formed on the gate insulating film 2. Thereafter, an oxide film 6' is deposited on the semiconductor substrate 1 covering the gate electrode 5 to a thickness of approximately 40 nm. Another insulating film made of a different material from the one used for the oxide film 6' such as a nitride film 7 is then deposited on the oxide film 6' to a thickness of approximately 100 nm.

Figure 5B:
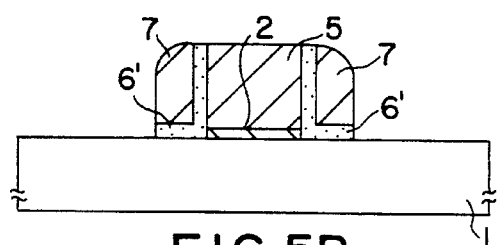

Then, as shown in FIG. 5B, the oxide film 6' and the nitride film 7 are etched by anisotropic dry etching, leaving portions thereof deposited on both sides of the gate electrode 5 unetched.

The remaining nitride film 7 is then completely removed by selective etching using a heated phosphoric acid solution. By adopting the selective etching, not anisotropic dry etching using plasma or the like, only the nitride film 7 can be selectively etched, while the oxide film 6' is hardly etched, without using a special mask. Thus, the L-shaped side walls 6 made of the oxide film are formed on the sides of the gate electrode 5. The resultant L-shaped side walls 6 have bottom portions outwardly extending along the surface of the semiconductor substrate 1 from the sides of the gate electrode 5, as shown in FIG. 5C. The length of the bottom portions along the channel region can be adjusted with high accuracy by controlling the thickness of the nitride film 7.

Figure 5C:
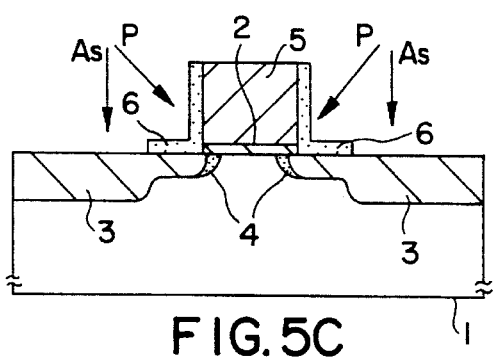

Thereafter, as shown in FIG. 5C, impurities of the second conductivity type such as As ions are implanted into the semiconductor substrate 1 at an accelerating energy of 80 KeV and a dose of approximately $6 \times 10^{15}$ cm$^{-2}$, thereby forming the high concentration source/drain diffusion regions 3. At this ion implantation step, part of the As ions are implanted into the semiconductor substrate 1 through the bottom portions of the L-shaped side walls 6, so that the relatively thin first portions of the high-concentration source/drain diffusion regions 3 are formed. At the same time, the remaining As ions are directly implanted into the semiconductor substrate 1, not through the bottom portions of the L-shaped side walls 6, so that the relatively thick second portions of the high-concentration source/drain diffusion regions 3 are formed. Thus, the PN-junction depth of the first portions located beneath the bottom portions of the L-shaped side walls 6 is smaller than that of the second portions located outside the bottom portions thereof. Since the length of the bottom portions of the L-shaped side walls 6 can be adjusted with high accuracy by controlling the thickness of the nitride film 7, the high-concentration source/drain diffusion regions 3 can be formed with high accuracy so that the ends thereof are located beneath the ends of the gate electrode 5.

Following the above As ion implantation step, impurities of the second conductivity type such as P ions are implanted into the semiconductor substrate 1 at an accelerating energy of 70 KeV and a dose of $4 \times 10^{13}$ cm$^{-2}$, thereby forming the low-concentration diffusion regions 4. This implantation is conducted at an angle of 45° from the surface of the semiconductor substrate 1. At this ion implantation step, part of the P ions are implanted into the semiconductor substrate 1 through the L-shaped side walls 6 at the angle 45°. Accordingly, the low-concentration diffusion regions 4 are formed so that the PN-junction depth thereof is equal to or smaller than that of the first portion of the high-concentration source/drain diffusion regions 3.

FIG. 9 is a contour diagram showing the impurity concentration distribution made up based on results obtained by simulating the MOS type semiconductor device of the present invention. In the simulation, As ions were implanted into the silicon substrate at an accelerating energy of 80 KeV and a dose of $6 \times 10^{15}$ cm$^{-2}$, thereby forming the high-concentration source/drain diffusion region. Subsequently, P ions were implanted into the silicon substrate at an accelerating energy of 60 KeV and a dose of $4 \times 10^{13}$ cm$^{-2}$, thereby forming the low-concentration impurity diffusion region.

As is apparent from FIG. 9, the PN-junction depth of a portion of the high-concentration source/drain diffusion region located beneath the L-shaped side walls is smaller than that of the remaining portion thereof located outside the L-shaped side wall. The impurity concentration of the former portion is as low as approximately $10^{19}$ cm$^{-3}$. The low-concentration diffusion region located beneath the gate electrode was formed so that the PN-junction depth thereof was in the same level as that of the portion of the high-concentration source/drain diffusion region beneath the L-shaped side wall.

Figure 10:
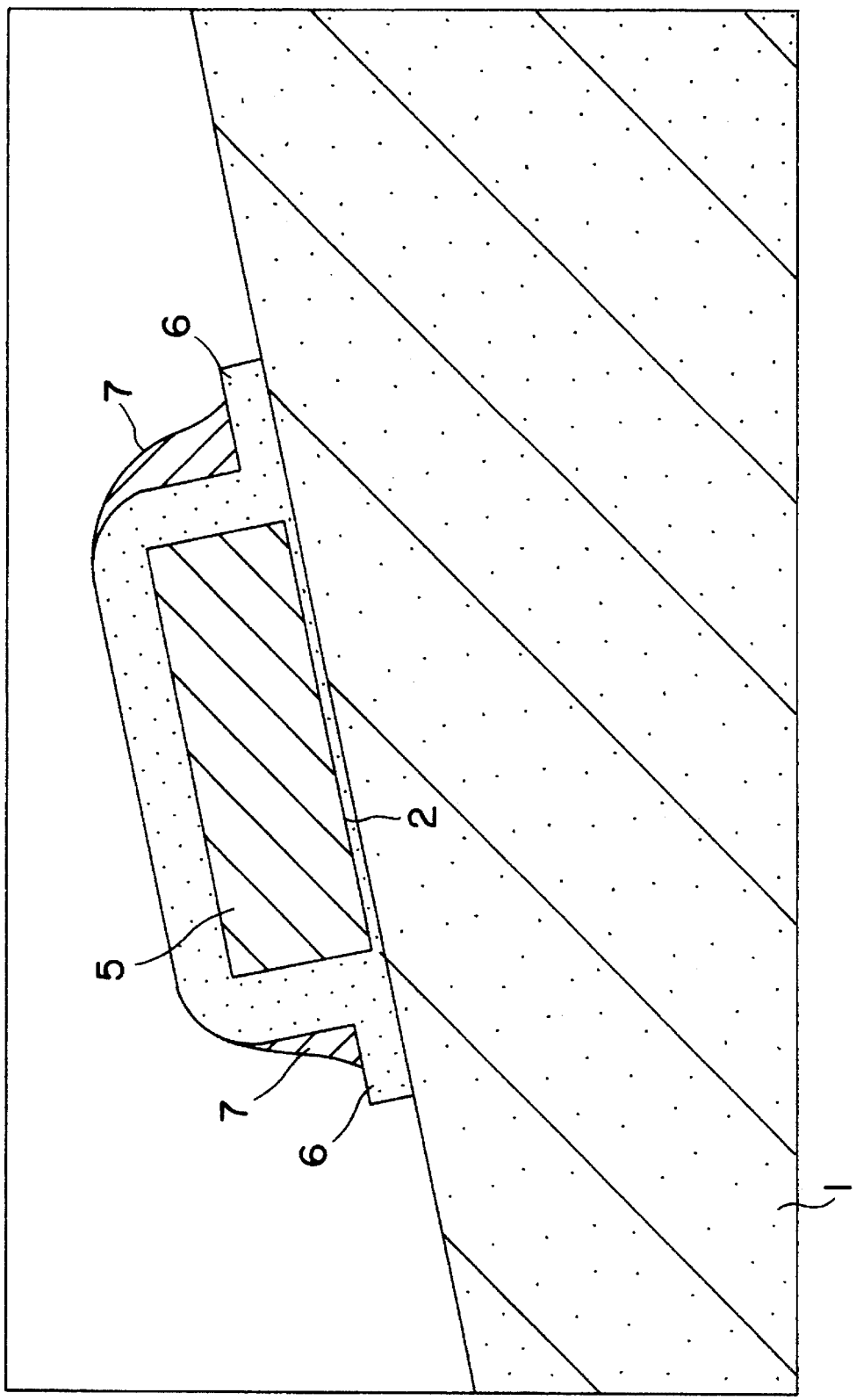
FIG. 10 is a view made up based on a TEM photograph of a section of an MOS type semiconductor device fabricated according to the method of the present invention.

FIG. 10 is a view made up based on a TEM (transmission electron microscopy) photograph of a section of the MOS type semiconductor device of this example. As is apparent from FIG. 10, the L-shaped side walls 6 have been formed with high accuracy.

As described above, according to the method for fabricating the MOS type semiconductor device of this example, the MOS type semiconductor device of FIG. 1 can be fabricated with high accuracy, and moreover with high efficiency since both the high-concentration source/drain diffusion regions and the low-concentration diffusion regions can be formed at one masking step.

EXAMPLE 6

Figure 6A:
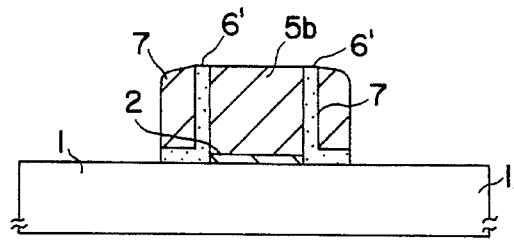
FIGS. 6A to 6D are sectional views showing the steps for fabricating the MOS type semiconductor device of the second example of the present invention.

Referring to FIGS. 6A to 6D, the method for fabricating the MOS type semiconductor device of Example 2 shown in FIG. 2 will be described as follows:

As shown in FIG. 6A, the gate insulating film 2 is formed on a portion of a surface of the p-type semiconductor substrate 1. Then, the gate electrode 5b is formed on the gate insulating film 2. Thereafter, an oxide film 6' is deposited on the semiconductor substrate 1 covering the gate electrode 5b to a thickness of approximately 40 nm. Another insulating film which does not transmit oxygen such as a nitride film 7 is then deposited on the oxide film 6' to a thickness of approximately 100 nm. Then, the oxide film 6' and the nitride film 7 are etched by anisotropic dry etching, leaving portions thereof deposited on both sides of the gate electrode 5b unetched.

Figure 6B:
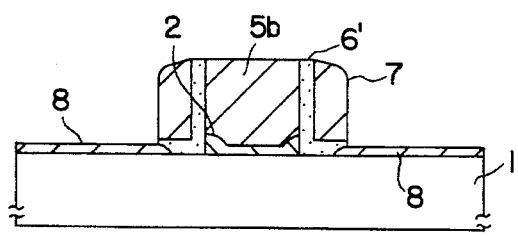

Then, as shown in FIG. 6B, an oxide film 8 is formed on the semiconductor substrate 1 by wet oxidation to a thickness of approximately 30 nm. At this oxidation step, most portions of the sides of the gate electrode 5b are hardly oxidized because they are covered with the nitride film 7 which does not transmit any oxidizing substance. However, the bottom portions of the sides thereof where the oxide film 6' is exposed outside allow the oxidizing substance to transmit therethrough. Thus, eventually, the bottom end portions of the gate electrode 5b adjacent to the gate insulating film 2 are oxidized by the oxidizing substance, thereby forming the downward convex-shaped bottom.

Figure 6C:
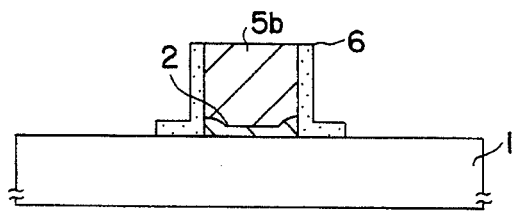

Then, as shown in FIG. 6C, the remaining nitride film 7 is completely removed by selective etching using, for example, a heated phosphoric acid solution. By adopting the selective etching, not anisotropic dry etching using plasma or the like, only the nitride film 7 can be selectively etched, while the oxide film 6' is hardly etched, without using a special mask. Thus, the L-shaped side walls 6 made of the oxide film are formed on the sides of the gate electrode 5b. The resultant L-shaped side walls 6 have bottom portions outwardly extending along the surface of the semiconductor substrate 1 from the sides of the gate electrode 5b, as shown in FIG. 6C. The length of the bottom portions along the channel can be adjusted with high accuracy by controlling the thickness of the nitride film 7.

Figure 6D:
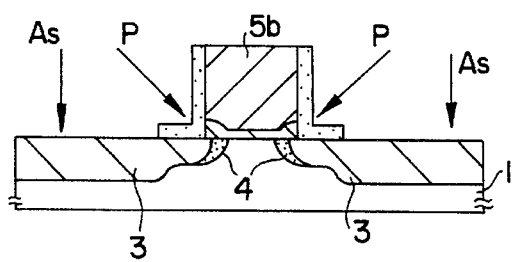

Thereafter, as shown in FIG. 6D, impurities of the second conductivity type such as As ions are implanted into the semiconductor substrate 1 at an accelerating energy of 80 KeV and a dose of approximately $6 \times 10^{15}$ cm$^{-2}$, thereby forming the high-concentration source/drain diffusion regions 3. At this ion implantation step, part of the As ions are implanted into the semiconductor substrate 1 through the bottom portions of the L-shaped side walls 6, so that the relatively thin first portions of the high-concentration source/drain diffusion regions 3 are formed. At the same time, the remaining AS ions are directly implanted into the semiconductor substrate 1, not through the bottom portions of the L-shaped side walls 6, so that the relatively thick second portions of the high-concentration source/drain diffusion regions 3 are formed. Thus, the PN-junction depth of the first portions located beneath the bottom portions of the L-shaped side walls 6 is smaller than that of the second portions located outside the bottom portions thereof. Since the length of the bottom portions of the L-shaped side walls 6 can be adjusted with high accuracy by controlling the thickness of the nitride film 7, the high-concentration source/drain diffusion regions 3 can be formed with high accuracy so that the ends thereof are located beneath the ends of the gate electrode 5b.

Following the above As ion implantation step, impurities of the second conductivity type such as P ions are implanted into the semiconductor substrate 1 at an accelerating energy of 70 KeV and a dose of approximately $4 \times 10^{13}$ cm$^{-2}$, thereby forming the low-concentration diffusion regions 4. This implantation is conducted at an angle of 45° from the surface of the semiconductor substrate 1. At this ion implantation step, part of the P ions are implanted into the semiconductor substrate 1 through the L-shaped side walls 6 at the angle 45°. Accordingly, the low-concentration diffusion regions 4 are formed so that the PN-junction depth thereof is equal to or smaller than that of the first portions of the high-concentration source/drain diffusion regions 3.

Thus, according to the method of this example, a downward convex-shaped gate electrode can be effectively formed without oxidizing the sides of the gate electrode. Further, both the high-concentration source/drain diffusion regions and the low-concentration diffusion regions can be efficiently formed at one masking step.

EXAMPLE 7

Figure 7A:
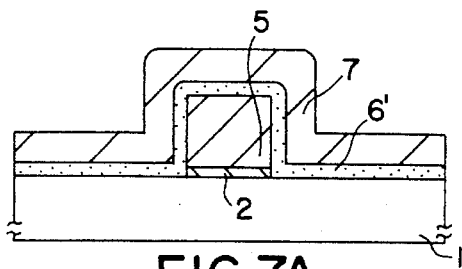
FIGS. 7A to 7D are sectional views showing the steps for fabricating the MOS type semiconductor device of the third example of the present invention.

Referring to FIGS. 7A to 7D, the method for fabricating the MOS type semiconductor device of Example 3 shown in FIG. 3 will be described as follows:

As shown in FIG. 7A, the gate insulating film 2 is formed on a portion of a surface of the p-type semiconductor substrate 1. Then, the gate electrode 5 is formed on the gate insulating film 2. Thereafter, an oxide film 6' is deposited on the semiconductor substrate 1 covering the gate electrode 5 to a thickness of approximately 40 nm. Another insulating film made of a different material from the one used for the oxide film 6' such as a nitride film 7 is then deposited on the oxide film 6' to a thickness of approximately 100 nm.

Figure 7B:
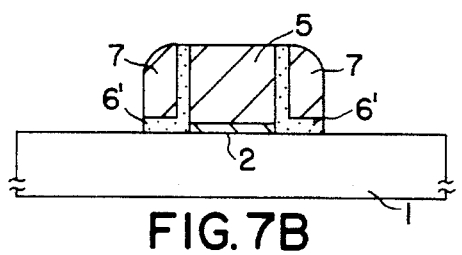

Then, as shown in FIG. 7B, the oxide film 6' and the nitride film 7 are etched by anisotropic dry etching, leaving portions thereof deposited on both sides of the gate electrode 5 unetched.

Figure 7C:
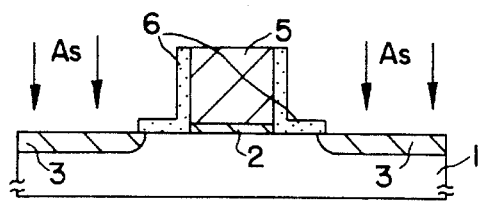

The remaining nitride film 7 is then completely removed by selective etching using a heated phosphoric acid solution. By adopting the selective etching, not anisotropic dry etching using plasma or the like, only the nitride film 7 can be selectively etched, while the oxide film 6' is hardly etched, without using a special mask. Thus, the L-shaped side walls 6 made of the oxide film are formed on the sides of the gate electrode 5. The resultant L-shaped side walls 6 have bottom portions outwardly extending along the surface of the semiconductor substrate 1 from the sides of the gate electrode 5, as shown in FIG. 7C. The length of the bottom portions along the channel region can be adjusted with high accuracy by controlling the thickness of the nitride film 7.

Thereafter, as shown in FIG. 7C, impurities of the second conductivity type such as As ions are implanted into the semiconductor substrate 1 at an accelerating energy of 40 KeV and a dose of approximately $6 \times 10^{15}$ cm$^{-2}$, thereby forming the high-concentration source/drain diffusion regions 3. At this ion implantation step, part of the As ions are blocked by the bottom portions of the L-shaped side walls 6. At the same time, the remaining As ions are directly implanted into the semiconductor substrate 1, not through the bottom portions of the L-shaped side walls 6, so that the high-concentration source/drain diffusion regions 3 are formed. The above AS ion implantation is conducted at the relatively low accelerating energy of 40 KeV. Accordingly, the high-concentration source/drain diffusion regions 3 are not formed beneath the bottom portions of the L-shaped side walls 6, and the PN-junction depth of the resultant high-concentration source/drain diffusion regions 3 is as low as approximately 0.1 μm.

Figure 7D:
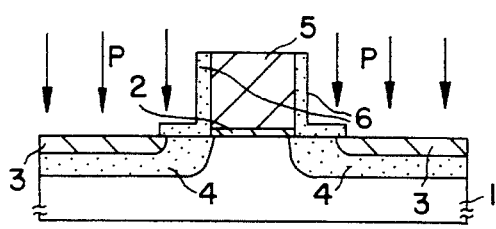

As shown in FIG. 7D, following the above As ion implantation step, impurities of the second conductivity type such as P ions are implanted into the semiconductor substrate 1 at an accelerating energy of 60 KeV and a dose of approximately $4 \times 10^{13}$ cm$^{-2}$, thereby forming the low-concentration diffusion regions 4. At this step, P ions are implanted into the semiconductor substrate 1 at an accelerating energy higher than that for the above As ion implantation. Accordingly, the P ions transmit through the L-shaped side walls 6 forming the low-concentration diffusion regions 4 extending to reach a portion of the semiconductor substrate 1 beneath the ends of the gate electrode 5.

Thus, according to the method of this example, both the high-concentration source/drain diffusion regions and the low-concentration diffusion regions can be efficiently formed at one masking step with high accuracy.

EXAMPLE 8

Figure 8A:
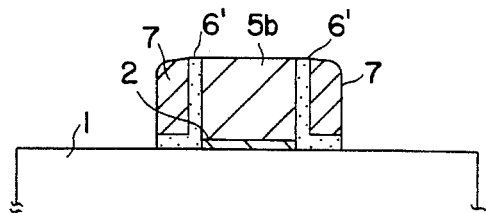
FIGS. 8A to 8D are sectional views showing the steps for fabricating the MOS type semiconductor device of the fourth example of the present invention.

Referring to FIGS. 8A to 8D, the method for fabricating the MOS type semiconductor device of Example 4 shown in FIG. 4 will be described as follows:

As shown in FIG. 8A, the gate insulating film 2 is formed on a portion of a surface of the p-type semiconductor substrate 1. Then, the gate electrode 5b is formed on the gate insulating film 2. Thereafter, an oxide film 6' is deposited on the semiconductor substrate 1 covering the gate electrode 5b to a thickness of approximately 40 nm. Another insulating film which does not transmit oxygen such as a nitride film 7 is then deposited on the oxide film 6' to a thickness of approximately 100 nm. Then, the oxide film 6' and the nitride film 7 are etched by anisotropic dry etching, leaving portions thereof deposited on both sides of the gate electrode 5b unetched.

Figure 8B:
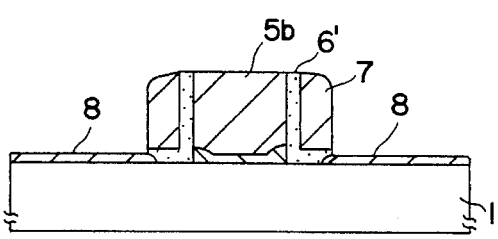

Then, as shown in FIG. 8B, an oxide film 8 is formed on the semiconductor substrate 1 by wet oxidation to a thickness of approximately 30 nm. At this oxidation step, most portions of the sides of the gate electrode 5b are hardly oxidized because they are covered with the nitride film 7 which does not transmit an oxidizing substance. However, the bottom portions of the sides thereof where the oxide film 6' is exposed outside allow the oxidizing substance to transmit therethrough. Thus, eventually, the bottom end portions of the gate electrode 5b adjacent to the gate insulating film 2 are oxidized by the oxidizing substance, thereby forming the downward convex-shaped bottom.

Figure 8C:
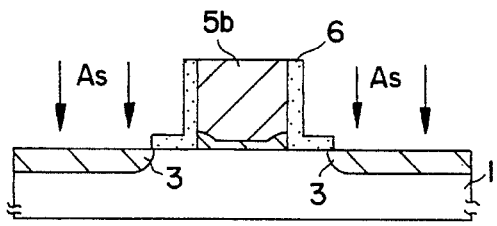

Then, as shown in FIG. 8C, the remaining nitride film 7 is completely removed by selective etching using, for example, a heated phosphoric acid solution. By adopting the selective etching, not anisotropic dry etching using plasma or the like, only the nitride film 7 can be selectively etched, while the oxide film 6' is hardly etched, without using a special mask. Thus, the L-shaped side walls 6 made of the oxide film are formed on the sides of the gate electrode 5b. The resultant L-shaped side walls 6 have bottom portions outwardly extending along the surface of the semiconductor substrate 1 from the sides of the gate electrode 5b, as shown in FIG. 8C. The length of the bottom portions along the channel region can be adjusted with high accuracy by controlling the thickness of the nitride film 7.

Thereafter, impurities of the second conductivity type such as As ions are implanted into the semiconductor substrate 1 at an accelerating energy of 40 KeV and a dose of $6 \times 10^{15}$ cm$^{-2}$, thereby forming the high-concentration source/drain diffusion regions 3. At this ion implantation step, part of the As ions are blocked by the bottom portions of the L-shaped side walls 6. At the same time, the remaining As ions are directly implanted into the semiconductor substrate 1, not through the bottom portions of the L-shaped side walls 6, so that the high-concentration source/drain diffusion regions 3 are formed. The above As ion implantation is conducted at the relatively low accelerating energy of 40 KeV. Accordingly, the high-concentration source/drain diffusion regions 3 are not formed beneath the bottom portions of the L-shaped side walls 6, and the PN-junction depth of the resultant high-concentration source/drain diffusion regions 3 is as low as approximately 0.1 µm.

Figure 8D:
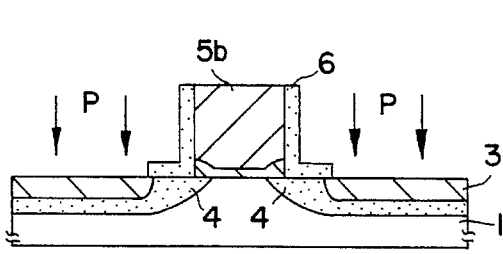

As shown in FIG. 8D, following the above As ion implantation step, impurities of the second conductivity type such as P ions are implanted into the semiconductor substrate 1 at an accelerating energy of 60 KeV and a dose of approximately $4 \times 10^{13}$ cm$^{-2}$, thereby forming the low-concentration diffusion regions 4. At this step, P ions are implanted into the semiconductor substrate 1 at an accelerating energy higher than that for the above As ion implantation. Accordingly, the P ions transmit through the L-shaped side walls 6 forming the low-concentration diffusion regions 4 extending to reach portions beneath the ends of the gate electrode 5b.

Thus, according to the method of this example, a downward convex-shaped gate electrode can be effectively formed without oxidizing the sides of the gate electrode. Further, both the high-concentration source/drain diffusion regions and the low-concentration diffusion regions can be efficiently formed at one masking step.

EXAMPLE 9

Figure 11:
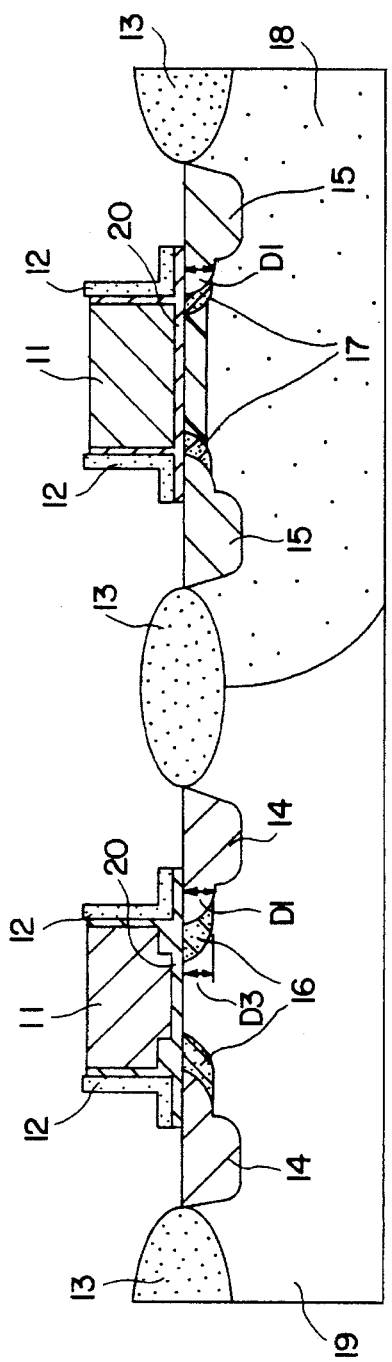
FIG. 11 is a sectional view of a complementary MOS type semiconductor device of the present invention.

FIG. 11 is a sectional view of a complementary MOS type semiconductor device of the present invention.

A semiconductor substrate 19 includes an n-type region (n-well) 18 doped with n-type impurities and a p-type region doped with p-type impurities. A LOCOS isolation 13 is formed on the isolation regions in the semiconductor substrate 19 for electrically isolating transistors.

An n-channel MOS transistor is formed in the surface area of the p-type region of the semiconductor substrate 19, while a p-channel MOS transistor is formed in the surface area of the n-well 18 thereof. The n-channel MOS transistor includes n-type high-concentration source/drain diffusion regions 14 formed in the p-type region of the semiconductor substrate 19, a gate insulating film 20 formed on a portion of the p-type region of the semiconductor substrate 19, a gate electrode 11 formed on the gate insulating film 20, and L-shaped side walls 12 made of an oxide film formed on the sides of the gate electrode 11. N-type low-concentration source/drain diffusion regions (low-concentration diffusion regions) 16 are also formed on respective ends of the high-concentration source/drain diffusion regions 14 adjacent to a channel region. The gate insulating film 20 has a relatively thin portion which covers the channel region and relatively thick portions which cover the low-concentration diffusion regions 16. The structure of the n-channel MOS transistor is substantially the same as that shown in FIG. 2.

The p-channel MOS transistor includes a p-type high-concentration source/drain diffusion regions 15 formed in the n-well 18, the gate insulating film 20 formed on a portion of the n-well 18, the gate electrode 11 formed on the gate insulating film 20, and the L-shaped side walls 12 made of an oxide film formed on the sides of the gate electrode 11. P-type low-concentration source/drain diffusion regions (low-concentration diffusion regions) 17 are also formed on respective ends of the high-concentration source/drain diffusion regions 15 adjacent to the channel region. The gate insulating film 20 for the p-channel MOS transistor has a uniform thickness unlike the gate insulating film 20 for the n-channel MOS transistor.

The PN-junction depth D1 of portions of the high-concentration source/drain diffusion regions 14 and 15 located beneath the L-shaped side walls 12 is made smaller than that of other portions thereof located outside the L-shaped side walls 12. Further, the low-concentration diffusion regions 16 and 17 are formed so that the PN-junction depth D3 thereof is equal to or smaller than the PN-junction depth D1 of the portions of the high-concentration source/drain diffusion regions 14 and 15 located beneath the L-shaped side walls 12. This structure is effective in restricting the potential expansion from the source/drain diffusion regions toward the channel region, and thus minimizing the decrease of the threshold voltage ($V_t$) which occurs for a miniaturized MOS transistor.

Further, since the low-concentration diffusion regions 16 of the n-channel MOS transistor is located beneath the relatively thick end portions of the gate insulating film 20, the gate-to-drain capacitance and the gate-to-source capacitance can be reduced without decreasing a drain current. Thus, the lateral electric field in the low-concentration diffusion regions 16 can be weakened by the vertical electric field produced in the gate electrode 11. On the other hand, a p-type MOS transistor is generally characterized in generating less hot carriers, having low drivability, and being easily degraded by reducing the channel length. According to the p-type MOS transistor of this example, the gate insulating film 20 has a uniform thickness, the low-concentration diffusion regions 17 are small in size, thereby securing a long effective channel length. With this structure, the parasitic resistance can be reduced and the short channel effects can be minimized.

EXAMPLE 10

Figure 12:
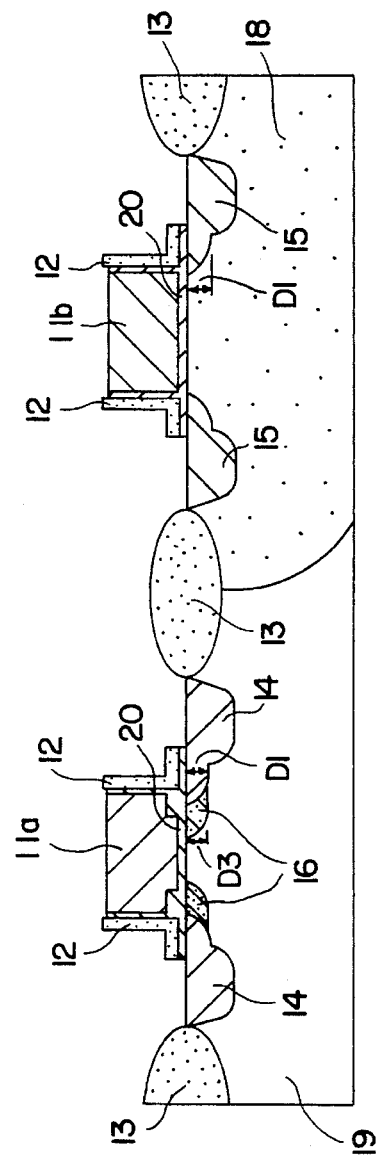
FIG. 12 is a sectional view of another complementary MOS type semiconductor device of the present invention.

FIG. 12 is a sectional view of another complementary MOS type semiconductor device of the present invention.

A semiconductor substrate 19 includes an n-type region (n-well) 18 doped with n-type impurities and a p-type region doped with p-type impurities. A LOCOS isolation 13 is formed on the isolation regions in the semiconductor substrate 19 for electrically isolating transistors.

An n-channel MOS transistor is formed in the surface area of the p-type region of the semiconductor substrate 19, while a p-channel MOS transistor is formed in the surface area of the n-well 18 thereof. The n-channel MOS transistor includes n-type high-concentration source/drain diffusion regions 14 formed in the p-type region of the semiconductor substrate 19, a gate insulating film 20 formed on a portion of the p-type region of the semiconductor substrate 19, a gate electrode 11a formed on the gate insulating film 20, and L-shaped side walls 12 made of an oxide film formed on the sides of the gate electrode 11a. N-type low-concentration source/drain diffusion regions (low-concentration impurity diffusion regions) 16 are also formed on respective ends of the high-concentration source/drain diffusion regions 14 adjacent to a channel region. The gate insulating film 20 has a relatively thin portion which covers the channel region and relatively thick portions which cover the low-concentration diffusion regions 16.

The p-channel MOS transistor includes a p-type high-concentration source/drain diffusion regions 15 formed in the n-well 18, the gate insulating film 20 formed on a portion of the n-well 18, a gate electrode 11b formed on the gate insulating film 20, and the L-shaped side walls 12 made of an oxide film formed on the sides of the gate electrode 11b. The gate insulating film 20 for the p-channel MOS transistor has a uniform thickness unlike the gate insulating film 20 for the n-channel MOS transistor.

A major structural difference between the complementary MOS type semiconductor devices of this example shown in FIG. 12 and Example 9 shown in FIG. 11 is that the p-type MOS transistor of this example is a surface channel transistor having the p-type gate electrode 11b. The surface channel type MOS transistor is superior to the buried channel type MOS transistor (shown in FIG. 11) in minimizing the short channel effects and the degradation caused by the generation of hot carriers. Thus, the p-type low-concentration diffusion regions for weakening the electric field and thus decreasing the generation of hot carriers can be excluded from the structure of this example. By excluding the p-type low-concentration diffusion regions, the parasitic resistance caused thereby can be prevented.

As in Example 9, the PN-junction depth D1 of portions of the high-concentration source/drain diffusion regions 14 and 15 located beneath the L-shaped side walls 12 is made smaller than that of other portions thereof located outside the L-shaped side walls 12. Further, the low-concentration diffusion regions 16 are formed so that the PN-junction depth D3 thereof is equal to or smaller than the PN-junction depth D1 of the portions of the high-concentration source/drain diffusion regions 14 located beneath the L-shaped side walls 12. This structure is effective in minimizing the potential expansion from the source/drain diffusion regions toward the channel region, and thus minimizing the decrease of the threshold voltage ($V_t$) which occurs for a miniaturized MOS transistor.

EXAMPLE 11

Now, referring to FIGS. 13A to 13F and 14A to 14E, the method for fabricating the complementary MOS type semiconductor device of Example 10 shown in FIG. 12 will be described as follows:

First, the n-well 18 is formed in part of the p-type semiconductor substrate 19, thereby forming the p-type region and the n-type region in the semiconductor substrate 19. Then, the LOCOS isolation 13 is formed by thermal oxidation on portions of the surface areas of the isolation regions of the semiconductor substrate 19. Then, as shown in FIG. 13A, a gate electrode 11 is formed on a portion of each of the p-type region and the n-well 18 with the gate insulating film 20 interposed therebetween.

Thereafter, as shown in FIG. 13B, a first oxide film 23 is deposited on the surface of the semiconductor substrate 19 covering the gate electrodes 11 to a thickness of approximately 5 nm.

Then, as shown in FIG. 13C, a second oxide film 25 is deposited on the first oxide film 23 to a thickness of approximately 40 nm. The second oxide film 25 is, for example, a silicon dioxide film formed by chemical vapor deposition. An insulating film which hardly transmits oxygen such as a nitride film 24 is then deposited on the second oxide film 25 to a thickness of approximately 100 nm.

Then, as shown in FIG. 13D, a resist 26 is selectively deposited on the surface of only the n-well 18 by photolithography.

As shown in FIG. 13E, portions of the second oxide film 25 and the nitride film 24 deposited on the p-type region of the semiconductor substrate 19 are then etched by anisotropic dry etching, thereby forming side walls consisting of the second oxide film 25 and the nitride film 24 on the sides of the gate electrode 11.

As shown in FIG. 13F, after the removal of the resist 26, a third oxide film 27 is deposited on the p-type region of the semiconductor substrate 19 to a thickness of approximately 30 nm by thermal oxidation such as the wet oxidation at 850° C. At this oxidation step, the bottom end portions of the gate electrode 11 adjacent to the gate insulating film 20 are also oxidized, thus thickening the end portions of the gate insulating film 20, as described in Example 6. At this time, the surface of the n-well 18 is not oxidized because it is covered with the nitride film 24.

Subsequently, as shown in FIG. 14A, the remaining second oxide film 25 and the nitride film 24 deposited on the n-well 18 are etched by anisotropic dry etching, thereby forming side walls consisting of the second oxide film 25 and the nitride film 24 on the sides of the gate electrode 11 formed on the n-well 18. By this anisotropic dry etching, top portions of the nitride film 24 remained on the sides of the gate electrode 11 formed on the n-type region are etched. Also, the second oxide film 25 and the third oxide film 27 (FIG. 13F) are etched by 10–20 nm.

Then, as shown in FIG. 14B, the nitride film 24 is completely etched by selective etching using, for example, a heated phosphoric acid solution, thereby forming the L-shaped side walls 12. By adopting the selective etching, not conventional anisotropic dry etching, only the nitride film 24 can be selectively etched while the oxide films 25 and 27 are hardly etched. Thus, the L-shaped side walls 12 are formed on the sides of the gate electrodes 11 with high accuracy.

Figure 14C:
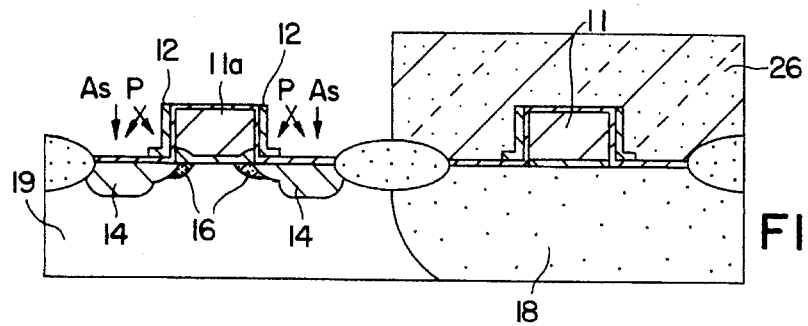

Then, as shown in FIG. 14C, another resist 26 is selectively deposited on the surface of the n-well 18 by photolithography. Using the gate electrode 11 and the L-shaped side walls 12 formed on the p-type region, as well as the resist 26, as a mask, n-type impurities such as As ions are implanted into the p-type region at an accelerating energy of 80 KeV and a dose of approximately $6 \times 10^{15}$ cm$^{-2}$, thereby forming the n-type high-concentration source/drain diffusion regions 14 and the n-type gate electrode 11a. Since the high-concentration source/drain diffusion regions 14 are formed using the L-shaped side walls 12 as a mask, the PN-junction depth of portions thereof located beneath the L-shaped side walls 12 is smaller than that of the remaining portions thereof located outside the L-shaped side walls 12. Further, since the length of the bottom portions of the L-shaped side walls 12 can be adjusted with high accuracy, the high-concentration source/drain diffusion regions 14 can be formed with high accuracy so that the ends thereof are located beneath the ends of the gate electrode 11a.

Subsequently, n-type impurities such as P ions are implanted into the p-type region at an accelerating energy of 80 KeV and a dose of approximately $4 \times 10^{13}$ cm$^{-2}$ at an angle of 45°, thereby forming the low-concentration diffusion regions 16. Since the P ions are implanted into the p-type region through the L-shaped side walls 12 at the angle 45°, the low-concentration diffusion regions 16 are formed so that the PN-junction depth thereof is equal to or smaller than that of the portions of the high-concentration source/drain diffusion regions 14 located beneath the L-shaped side walls 12.

Figure 14D:
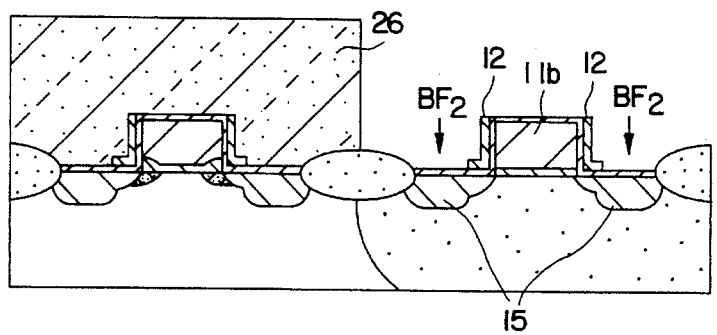

Then, as shown in FIG. 14D, yet another resist 26 is selectively deposited on the surface of the p-type region by photolithography. Using the gate electrode 11 and the L-shaped side walls 12 formed on the n-well 18, as well as the resist 26, as a mask, p-type impurities such as BF$_2$ ions are implanted into the n-well 18 at an accelerating energy of 40 KeV and a dose of approximately $4 \times 10^{15}$ cm$^{-2}$, thereby forming the p-type high-concentration source/drain diffusion regions 15 and the p-type gate electrode 11b.

Figure 14E:
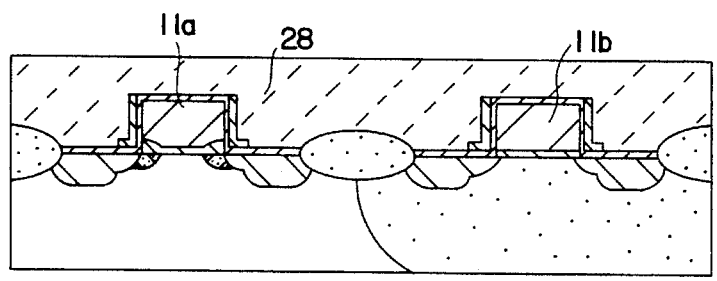

Finally, as shown in FIG. 14E, after the removal of the resist 26, an insulating film 28 is deposited on the semiconductor substrate 19 covering both the n-channel MOS transistor and the p-channel MOS transistor.

The above-described fabrication method includes many self-alignment steps and thus can be easily implemented by use of the existing LSI technology. By employing this method, the complementary MOS type semiconductor device shown in FIG. 12 can be easily fabricated with relatively small number of steps and with high yield.

EXAMPLE 12

Figure 15A:
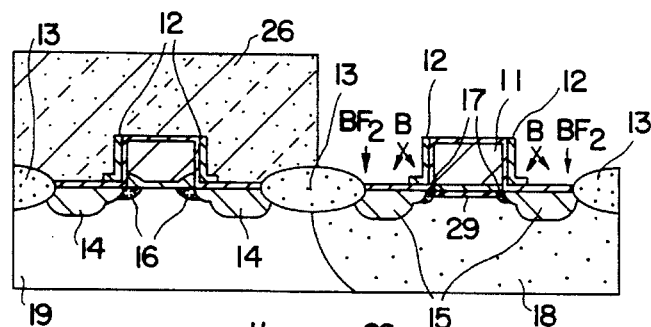
FIGS. 15A and 15B are sectional views showing the steps for fabricating the complementary MOS type semiconductor device shown in FIG. 11 of the present invention.
Figure 15B:
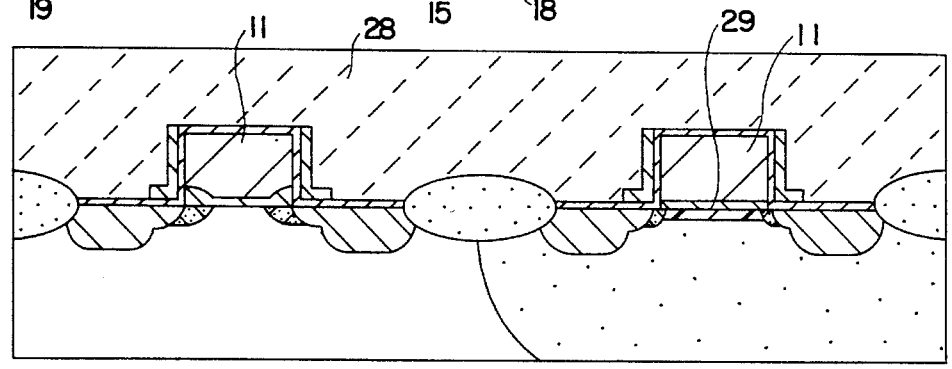
Figure 16:
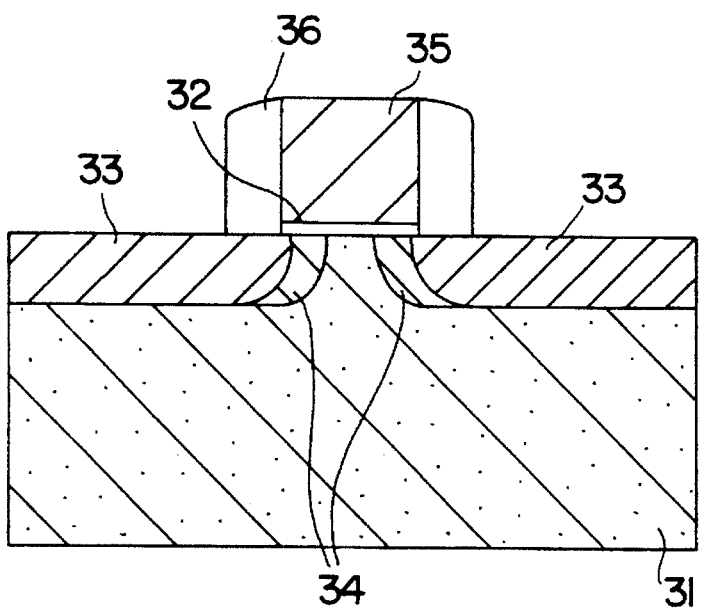
FIG. 16 is a sectional view of a conventional MOS type semiconductor device.
Figure 17A:
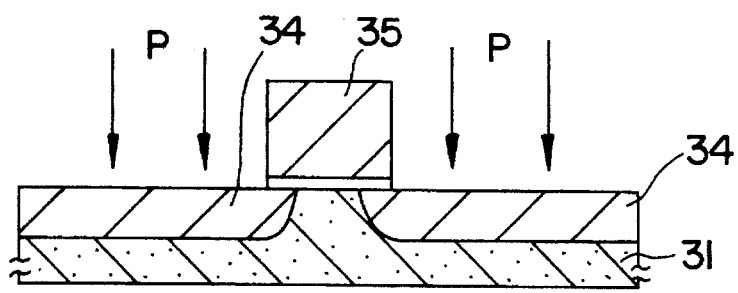
FIGS. 17A to 17C are sectional views showing the steps for fabricating a conventional MOS type semiconductor device.
Figure 17B:
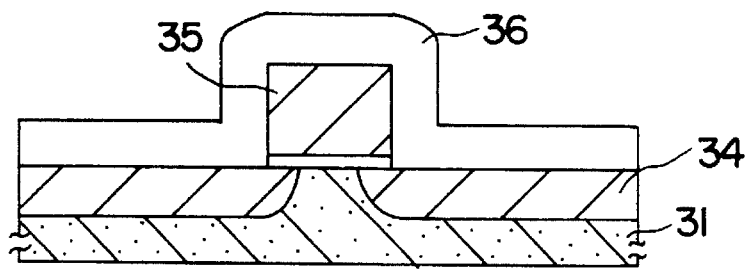
Figure 17C:
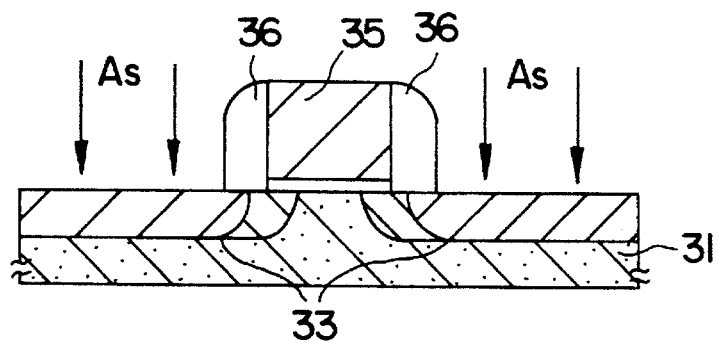

Referring to FIGS. 15A and 15B, the method for fabricating the MOS type semiconductor device of Example 9 shown in FIG. 11 will be described as follows:

The fabricating method of this example includes steps similar to those described in Example 11 with reference to FIGS. 13A to 13F and 14A to 14C. Therefore, the description of these steps will be omitted, and subsequent steps will be described as follows with reference to FIGS. 15A and 15B:

After the step shown in FIG. 14C is completed, a resist 26 is selectively deposited on the surface of the p-type region by photolithography. Using the gate electrode 11 and the L-shaped side walls 12 formed on the n-well 18, as well as the resist 26, as a mask, p-type impurities such as $BF_2$ ions are implanted into the n-well 18 at an accelerating energy of 40 KeV and a dose of approximately $4\times10^{15}$ $cm^{-2}$, thereby forming the p-type high-concentration source/drain diffusion regions 15 and the p-type gate electrode 11. Simultaneously, p-type impurities such as boron (B) ions are implanted into the n-well 18 at an accelerating energy of 30 KeV and a dose of approximately $4\times10^{13}$ $cm^{-2}$ at an angle of 45°, thereby forming the p-type low-concentration diffusion regions 17. Since the B ions are implanted into the n-well 18 through the L-shaped side walls 12 at the angle 45°, the low-concentration diffusion regions 17 are formed so as to reach portions of the n-well 18 beneath the ends of the gate electrode 11 and so as to have a PN-junction depth equal to or smaller than that of the portions of the high-concentration source/drain diffusion regions 15 located beneath the L-shaped side walls 12.

Finally, as shown in FIG. 15B, after the removal of the resist 26, an insulating film 28 is deposited on the semiconductor substrate 19 covering both the n-channel MOS transistor and the p-channel MOS transistor.

Thus, according to the fabricating method of this example, the complementary MOS type semiconductor device shown in FIG. 11 can be easily fabricated.

As described above, according to the MOS type semiconductor device of the present invention, the PN-junction depth of portions of the source/drain diffusion regions located beneath the L-shaped side walls formed on the sides of the gate electrode is smaller than that of the remaining portions thereof located outside the L-shaped side walls. Also, the PN-junction depth of the low-concentration diffusion regions is equal to or smaller than the PN-junction depth of the portions of source/drain diffusion regions located beneath the L-shaped side walls. This structure is more effective in minimizing potential expansion from the source/drain diffusion regions toward the channel region, compared with the conventional gate-drain overlap LDD structure. This results in effectively minimizing the decrease of the threshold voltage ($V_t$) which occurs for a miniaturized MOS type semiconductor device having a channel length of half a micron or less.

The high-concentration source/drain diffusion regions are formed to reach portions beneath the ends of the gate electrode with the gate insulating film interposed therebetween, and the low-concentration regions are entirely located beneath the gate electrode. With this structure, the electric field generated laterally in the low-concentration diffusion regions can be sufficiently weakened by a potential applied to the gate electrode, as in the conventional gate-drain overlap LDD structure.

The impurity concentration of the portions of the high-concentration source/drain diffusion regions where the ion implantation is conducted through the L-shaped side walls is as low as approximately $10^{19}$ $cm^{-3}$. This further weakens the lateral electric field, thereby decreasing the gate-to-drain capacitance.

Since electrons trapped in the outside oxide film and the surface state produced thereby are located above the high-concentration source-drain diffusion regions, they will not accelerate the degradation of the device characteristics. Thus, hot carriers are less generated. Moreover, carriers in the low-concentration diffusion regions are completely controlled by the gate electrode, and the source resistance at the low-concentration diffusion regions is reduced. As a result, the drivability of the device improves.

The gate insulating film may be made thicker in both end portions than in the center portion. And, the low-concentration diffusion regions of the second conductivity type are located beneath the ends of the gate electrode. Thus, since the end portions of the gate insulating film located above the low-concentration diffusion regions are thicker than the center portion thereof located above the channel region, the gate-to-drain capacitance is reduced, improving the circuit characteristics of the device. Further, the tunnel current between the bands induced by the potential applied to the gate electrode is reduced. Accordingly, a high-speed and highly-reliable MOS type semiconductor device which can minimize the degradation caused by a reduced channel length and can be miniaturized having a channel length of half a micron or less without degrading the electric characteristics and drivability of the device.

The method for fabricating the MOS type semiconductor device of the present invention includes the steps of removing the third insulating film by selective etching to form the L-shaped second insulating film and implanting impurity ions using the gate electrode as a mask through the bottom portions of the second insulating film so as to form the high-concentration source/drain diffusion regions of the second conductivity type. By these steps, the high-concentration source/drain diffusion regions of the MOS type semiconductor device of the present invention can be effectively formed by one ion implantation step. The capacitance of the high-concentration source/drain diffusion regions and the gate electrode can be completely controlled.

In succession to the above ion implantation step, the low-concentration diffusion regions of the second conductivity type is formed by ion implanting ions through the L-shaped side walls. Accordingly, the high-concentration source/drain diffusion regions and the low-concentration diffusion regions can be formed by one masking step.

The end portions of the gate insulating film can be effectively thickened by oxidation without oxidizing the sides of the gate electrode, thereby forming the MOS semiconductor device of the present invention with high efficiency.

Thus, the present invention provides an MOS type semiconductor device with high reliability and high performance which can minimize the short channel effects which are required for a VLSI having a channel length of half a micron or less and the degradation caused by the generation of hot carriers. The present invention also provides a method for fabricating such an MOS type semiconductor device effectively and highly accurately. Accordingly, the commercial value thereof is significantly high.

According to the complementary MOS type semiconductor device of the present invention, the PN-junction depth of portions of the source/drain diffusion regions located beneath the L-shaped side walls formed on the sides of the gate electrode is smaller than that of the remaining portions thereof located outside the L-shaped side walls. Also, the PN-junction depth of the low-concentration diffusion regions is equal to or smaller than the PN-junction depth of the source/drain diffusion regions located beneath the L-shaped side walls. This structure is more effective in minimizing potential expansion from the source/drain diffusion regions toward the channel region. This results in effectively minimizing the decrease of the threshold voltage ($V_t$) which occurs for a miniaturized MOS type semiconductor device having a channel length of half a micron or less.

The low-concentration impurity regions of the second conductivity type formed in the semiconductor substrate of the first conductivity type are entirely located beneath the gate electrode. With this structure, the electric field generated laterally in the low-concentration diffusion regions can be sufficiently weakened by a potential applied to the gate electrode as in the conventional gate-drain overlap ODD structure, thus reducing the generation of hot carriers. Moreover, carriers in the low-concentration diffusion regions can be completely controlled by the gate electrode, and the source resistance at the low-concentration diffusion regions is reduced. As a result, the drivability of the device improves.

The gate insulating film may be made thicker in both end portions than in the center portion. Thus, since the end portions of the gate insulating film located above the low-concentration diffusion regions are thicker than the center portion thereof located above the channel region, the gate-to-drain capacitance is reduced, improving the circuit characteristics of the device.

According to the complementary MOS type semiconductor device of the present invention, the gate insulating film formed on the well of the second conductivity type has a uniform thickness. With this structure, the overlap portion of the low-concentration diffusion regions of the first conductivity type with the gate electrode can be minimized, and thus the effective channel length can be maximized with respect to the gate length without increasing the parasitic resistance.

Thus, the present invention provides a complementary MOS type semiconductor device with high speed and high reliability which can minimize the short channel effects and can be miniaturized with a channel length of half a micron or less without degrading electric characteristics and drivability.

The end portions of the gate insulating film can be effectively thickened without oxidizing the sides of the gate electrode. This is possible by the step of leaving the third insulating film which hardly transmits an oxidizing substance on the well of the second conductivity type and on the sides of the gate electrode formed on the first conductivity type semiconductor substrate and the oxidation step.

Thus, the present invention provides a complementary MOS type semiconductor device with high reliability and high performance which can minimize the short channel effects which are required for a VLSI having a channel length of half a micron or less and the degradation caused by the generation of hot carriers. The present invention also provides a method for fabricating such a complementary MOS type semiconductor device effectively and highly accurately. Accordingly, the commercial value thereof is significantly high.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A complementary MOS type semiconductor device comprising a semiconductor substrate including an n-type region doped with n-type impurities and a p-type region doped with p-type impurities and having a surface, an n-channel MOS transistor formed in said p-type region, and a p-channel MOS transistor formed in said n-type region, said n-channel MOS transistor including:

an n-type source region formed in said p-type region;

an n-type drain region formed in said p-type region and separated from said n-type source region by a first predetermined distance;

a first channel region formed in said p-type region and located between said n-type source region and said n-type drain region;

a pair of n-type impurity diffusion regions formed on both sides of said first channel region and having an impurity concentration lower than that of said n-type source region;

a first gate insulating film formed on said surface of said semiconductor substrate, said first gate insulating film directly covering said first channel region and said pair of n-type impurity diffusion regions, portions of said first gate insulating film above said pair of n-type impurity diffusion regions being thicker than a portion thereof above said first channel region; and a first gate electrode formed on said first gate insulating film, said p-channel MOS transistor including:

a p-type source region formed in said n-type region;

a p-type drain region formed in said n-type region and separated from said p-type source region by a second predetermined distance;

a second channel region formed in said n-type region and located between said p-type source region and said p-type drain region;

a second gate insulating film formed on said surface of said semiconductor substrate and having a uniform thickness; and a second gate electrode formed on said second gate insulating film.

2. A complementary MOS type semiconductor device according to claim 1, wherein at least one specific MOS transistor selected among said n-channel MOS transistor and said p-channel MOS transistor includes side walls formed on the sides of said gate electrode of said specific MOS transistor, each of said side walls having a bottom portion extending along said surface of said semiconductor substrate from each side of said gate electrode of said specific MOS transistor, and each of said n-type source and drain regions has a first portion covered with said bottom portion of said side wall and a second portion not covered with said bottom portion, a thickness of said first portion being smaller than that of said second portion.

3. A complementary MOS type semiconductor device according to claim 2, wherein said first portion of each of said n-type source and drain regions reaches portion beneath each end of said gate electrode.

4. A complementary MOS type semiconductor device according to claim 1, wherein said second channel region of said p-channel MOS transistor has a p-type buried channel structure, and p-type impurity diffusion regions having an impurity concentration lower than that of said p-type source and drain regions are formed on both sides of said channel region.

5. A complementary MOS type semiconductor device according to claim 1, wherein said gate electrode of said p-channel MOS transistor is a p-type gate electrode.

* * * * *